United States Patent [19]
Eschler

[11] 3,989,347
[45] Nov. 2, 1976

[54] ACOUSTO-OPTICAL DATA INPUT TRANSDUCER WITH OPTICAL DATA STORAGE AND PROCESS FOR OPERATION THEREOF

[75] Inventor: Hans Eschler, Munich, Germany

[73] Assignee: Siemens Aktiengesellschaft, Berlin & Munich, Germany

[22] Filed: June 17, 1975

[21] Appl. No.: 587,732

[30] Foreign Application Priority Data
June 20, 1974 Germany............................ 2429612

[52] U.S. Cl............................ 350/3.5; 340/173 LM; 350/161
[51] Int. Cl.²..................... G03H 1/04; G11C 13/04
[58] Field of Search............................ 350/3.5, 161; 340/173 LT, 173 LM

[56] References Cited
UNITED STATES PATENTS

| 3,657,473 | 4/1972 | Corcoran | 350/3.5 |
|---|---|---|---|
| 3,698,794 | 10/1972 | Alphonse | 350/3.5 |
| 3,731,231 | 5/1973 | Torquet | 350/161 |
| 3,937,555 | 2/1976 | Kurtz | 350/3.5 |

OTHER PUBLICATIONS
Montgomery et al., *Proc. of Electro-Optical System Design Conf.*, New York, Sept. 1972, pp. 295–308.

Aleksoff et al., *Applied Optics*, vol. 14, No. 1, Jan. 1975, pp. 134–141.

*Primary Examiner*—Ronald J. Stern
*Attorney, Agent, or Firm*—Hill, Gross, Simpson, Van Santen, Steadman, Chiara & Simpson

[57] ABSTRACT

The present invention is directed to the improvements in an apparatus for holographically recording data on a storage medium with the data being block-organized holographic data by spatially modulating a laser beam into a plurality of object beams which are directed at a storage medium to interfere with a reference beam to form the holographic recording. The improvements are that the means for spatially modulating comprises an acousto-optical light deflector having a large area, piezoelectric sound transducers disposed on the one side thereof, the sound transducer having $n$ electrodes spaced thereon to form $n$ transducer units which receive a signal with a frequency mixture of $m$ frequencies to deflect the beam passing through each unit into $m$ beam directions with the light frequency of each beam having a Doppler shift associated with the amount of deflection. The apparatus also includes providing a lens raster consisting of $n$ times $m$ lens elements arranged in a manner to widen each of the object beams to illuminate the entire hologram and means for compensating for the Doppler shift in the light frequencies of the object beams.

10 Claims, 11 Drawing Figures

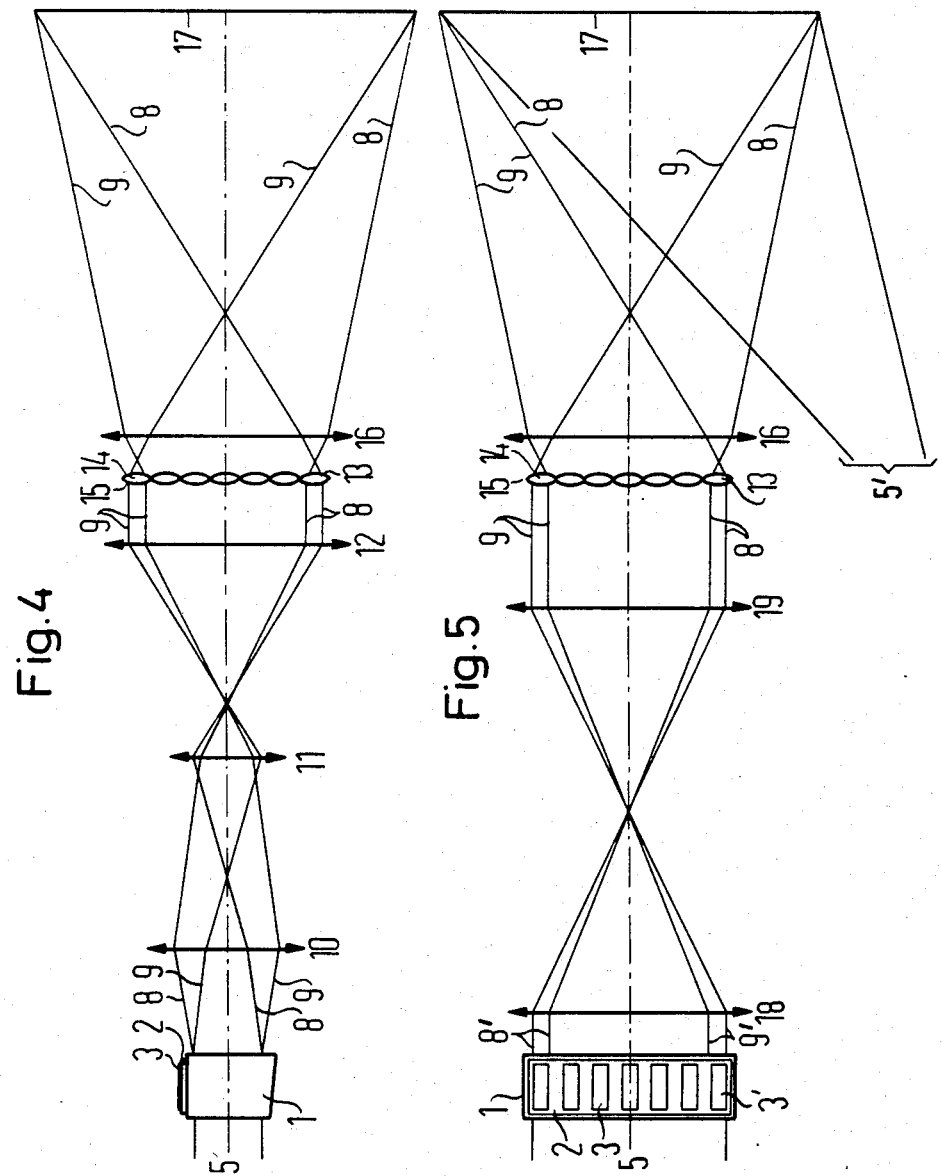

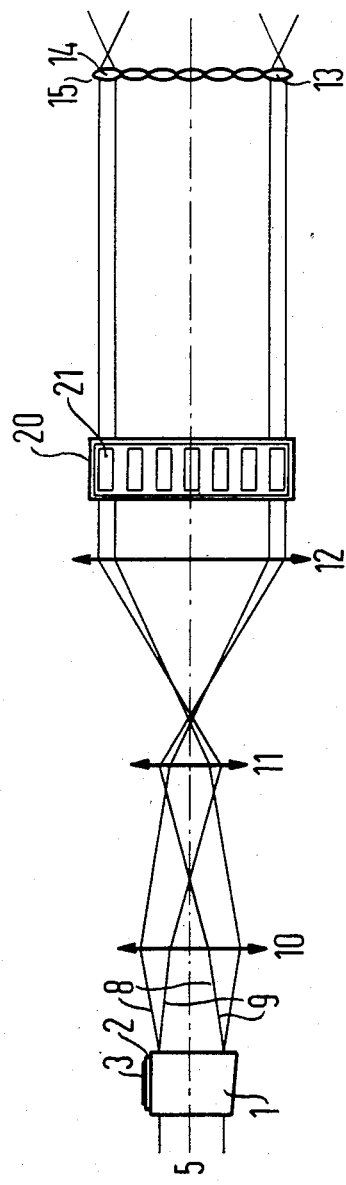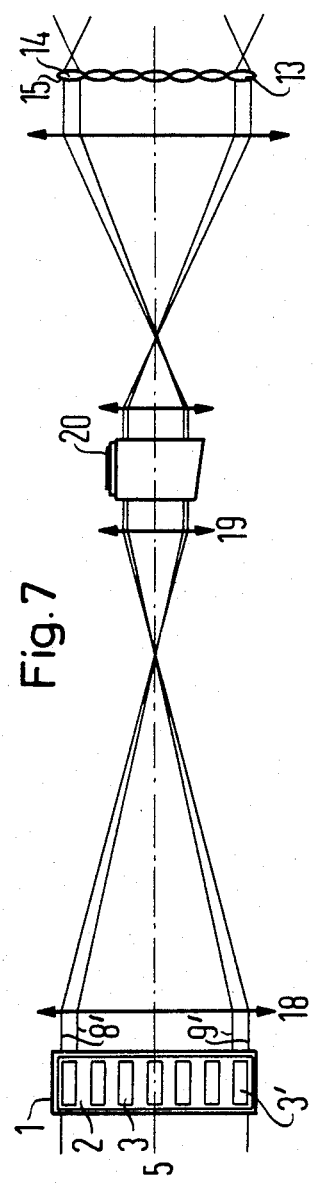

ACOUSTO-OPTICAL DATA INPUT TRANSDUCER WITH OPTICAL DATA STORAGE AND PROCESS FOR OPERATION THEREOF

BACKGROUND OF THE INVENTION

1. Field of the Invention

The present invention is directed to an acousto-optical data input transducer and a method for using the transducer in an arrangement for holographically recording data on the storage medium in the form of block-organized holographic data. The input transducer consists of an acousto-optical light deflector operated by electrical signals and a laser whose light beam is spatially modulated into a plurality of object beams by an acousto-optical light deflector and directed to a storage medium for recording.

2. Prior Art

Acousto-optical data input transducers for holographic data recording are disclosed for example in an article by R. M. Montgomery and J. W. Watkins, "High Data Rate Holographic Recording Using Acousto-Optic Input Devices", *Proc Electro-Optical System Design Conference*, New York, September 1972, Pages 295–308. The two-dimensional data transducer described in this article comprises a glass block which is provided with a plurality of piezoelectric transducers on one side thereof. Each of the transducers receives in a serial fashion a keyed high frequency signal which represents the item of data to be stored in the row of data block. The piezo transducer transmits a high frequency ultrasonic wave into the glass block which wave is modulated in the timing of the row of data and passes through the block at a speed of sound. As soon as the entire item of data fills the aperture of the glass block, the block is illuminated with an extremely short laser pulse during which time of illumination, the sound wave practically remains immobile. The spatially modulated light waves, which are a first order of diffraction, is focused by lenses onto a part of the storage tape to have the data recorded thereon.

Because of the requirement for a nano-second pulse laser with a high repetition frequency, which is greater than 1 kHz, the transducer described in the article is less suitable for certain applications. For example, this data transducer for reasons of efficiency is not suited for use in holographic block storage with the block sizes of about $10^4$ bits which are recorded on a stationary data carrier or medium.

SUMMARY OF THE INVENTION

The present invention is directed to a two-dimensional acousto-optical data transducer which can be illuminated with a continous line laser and which can be operated with low control powers.

To accomplish this task in accordance with the present invention, an acousto-optical light deflector or data transducer having a large area piezoelectric sound transducer disposed on one side thereof is utilized as a means for spatially modulating a laser beam having a coherent optical plane wave into a plurality of object beams. The large area sound transducer is provided with $n$ electrodes spaced thereon to form $n$ transducer units and means are associated with each electrode for creating and applying a signal to each electrode with the signal being a frequency mixture of $m$ frequencies to deflect the beam passing through each unit into $m$ beam directions with the light frequency of each beam direction having a Doppler shift which depends on the amount of deflection. In addition to the acousto-optical transmitter, the invention utilizes a lens raster consisting of $n$ times $m$ lens elements arranged in such a manner that each of the individual object beams produced by the means for modulating is widened to illuminate the entire storage medium and the lens raster is part of the means for directing the object beams to the storage medium. In addition to the above, the improved apparatus includes means for eliminating or compensating for the influence of the Doppler shift in the light frequencies of each of the object beams so that the capacity of interference of each of the object beams with the reference beams is not destroyed.

In this compact data transducer it is possible to obtain a raster of $n$ times $m$ coherent light sources which may be switched simultaneously so that in each of the $n$ deflector units, $m$ beam directions are simultaneously produced if a frequency mixture is applied to each deflector unit. The discrete directions may be switched on and off independently of one another with the switching time being governed by the transit time of the sound wave in the deflector unit and the transit time is between 1 and 10 $\mu$sec. The piezoelectric transducer which serves to produce the sound waves covers the major part of the upper surface of the deflector. Arranged upon the transducer is an n-component electrode structure which serves to input-couple the electric control signals. Each part or unit of the deflector which lies beneath one electrode can be used to produce $m$ beams which may be modulated independently of one another, and thus the entire transducer can produce $n$ times $m$ desired beams. As the $n$ components of the deflector operate in parallel, the switching time of the overall data transducer is approximately 5 $\mu$sec., which is a period of time which is some orders of magnitude below that of most known data transducers.

The data transducer of the present invention may be used, in particular, in storage systems in which the storage medium is always illuminated in a perpendicular fashion, irrespective of which sub-hologram is currently to be recorded thereon.

In acousto-optical components, the light frequency is shifted upwards or downwards by the sound frequency as a result of the Doppler effect. When deflection by several frequencies takes place simultaneously in the data transducer, the beams produced by a part of the deflector are displaced from one another in their frequency. Therefore, the individual sub-beams are not capable of interfering either with one another or with the reference beam.

To eliminate this harmful influence of the Doppler shift, the means for compensating for the Doppler shift may be a laser which has a band width which is greater than the Doppler shift. A maximum spread of the Doppler shift of 40 MHz of the frequency of an object beam is then counteracted by a laser band width of 200 MHz, so that the altered frequency remains within the laser band width and the laser beam, which serves as object beam, will interfere with the reference beam. Dye lasers or super-radiation lasers are advantageously used as lasers.

Since commercially available high-power lasers are mainly gas lasers with a line width in the order of 1 KHz, the means for compensating for the Doppler shift may be an acousto-optical Doppler compensator. The Doppler shift is compensated by placing the acousto-optical Doppler compensator between the acousto-optical light deflector and the lens raster. This Doppler compensator is identical in its basic construction with the acousto-optical light deflector, but it is subject to less stringent requirements in terms of beam stability.

As all the beams which are deflected by the data transducer in the same direction i (1, 2 ..., i, m,) experience the same frequency shift, one sub-deflector in the Doppler compensator will suffice to compensate the frequency shift in all object beams deflected in the same direction. Thus, the compensator requires one light deflector with an $m$ component electrode structure. Thus, the $i$-th electrode of the Doppler compensator is operated with the required frequency which compensates for the Doppler shift of the frequency of light of all object beams which were deflected into the direction $i$. However, each beam of a given direction only fills $l/n$ of the overall aperture of the given direction sub-deflector in the Doppler compensator. This means that the lateral deflection of the beams is approximately equal to the angle of diffraction of the beams and in conjunction with the lens raster is scarecely of significance.

Furthermore, by positioning the Doppler compensator to be slightly oblique it is possible to compensate for the slight rhombic distortion of the light source raster.

Each sub-deflector or deflector unit of the Doppler compensator, in contrast to the data transducer, is operated only with one single frequency which is identical to the Doppler shift of the group of beams which is to be compensated. The group of beams of a given direction and compensator are adjusted to one another in such a way that the Doppler shift of the compensator actually compensates the shift created by the data transducers. For example, if the deflection which is made in the data transducer is the positive first order of diffraction, the Doppler compensator will create a negative first order of diffraction or vice versa.

The acousto-optical data input transducer is operated by illuminating the transducer with a continuous line laser and the $n$ times $m$ items of data are fed by operating signals via adders to the $n$ electrodes of the acousto-optical light deflector.

The object beams transmitted in the $n$ times $m$ directions are obtained in order to represent a logic one or zero by switching on and off the operating frequency responsible for a specific direction. However, the object beams transmitted in the $n$ times $m$ directions may be continuously produced and a logic zero is created by controlling the compensation for the Doppler shift in the acousto-optical light deflector in such a manner that the interference capacity between object beams and reference beams is prevented. An advantage of the second method is that it achieves a degree of efficiency of virtually 100% without additional compensation electronics. Since all the directions of the light beams are permanent, thermally induced beam deflections can also be compensated in the deflector units to provide an improvement in the transmission of the data transducer.

BRIEF DESCRIPTION OF THE DRAWINGS

FIGS. 4 and 5 are schematic presentations of the apparatus using the transducer of the present invention taken in the $y$–$z$ and $x$–$z$ planes, respectively;

FIGS. 6 and 7 are partial schematic presentations of the device of FIGS. 4 and 5 with a Doppler shift compensator taken in the $y$–$z$ and $y$–$z$ planes, respectively;

DESCRIPTION OF THE PREFERRED EMBODIMENTS

Figure 1:
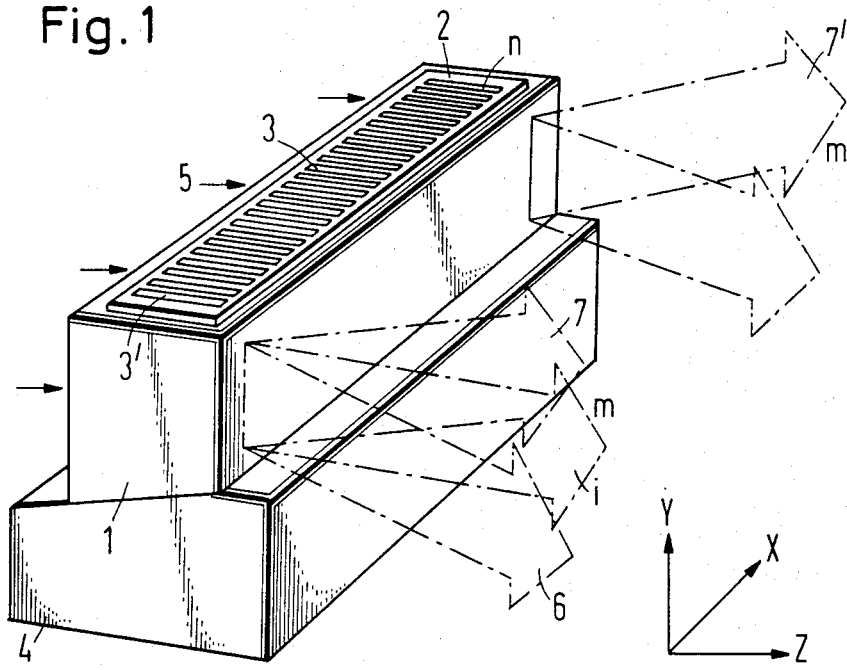
FIG. 1 is a perspective view of an acousto-optical data input transducer according to the present invention.

The principles of the present invention are particularly useful when incorporated in an acousto-optical input data transducer illustrated in FIG. 1.

The transducer has a glass body 1 with a piezoelectric sound transducer 2 which is disposed on one surface and has an electrode structure 3 with $n$ separate electrodes such as electrode 3'. The sound transducer 2 is applied so as to adhere by molecular adhesion to the glass block 1 which consists of tellurium dioxide glass. A sound absorber 4 of aluminum is arranged on a surface of the glass block 1 opposite to the sound transducer 2. The boundary area between glass block 1 and the sound absorber 4 is oblique so that the reflected residual sound waves will not fulfill the Bragg condition with the oncoming group of parallel laser light beams or coherent optical plane wave 5 and thus will not contribute to the light deflection.

A portion of the body 1 beneath each electrode of the electrode structure acts as a separate deflecting unit or "subdeflector" and a part of the group of laser beams 5, which passes through the glass block 1 which serves as a sound medium in the space beneath the electrode 3', will experience a simultaneous deflection in $m$ beam directions ( 1, 2 ..., $i$, ... $m$) in accordance with the arrows 6, $i$ and 7 which are emerging from the glass block 1 in the $y$–$z$ plane. Since $n$ electrodes are arranged on the piezo-transducer to form $n$ deflecting units and each unit can deflect the light in $m$ beam directions, $n$ times $m$ desired beam directions can be produced with the component of FIG. 1. As the $n$ "sub-deflectors" or deflecting units which are arranged beneath the $n$ electrodes operate in parallel to one another, the switching time of the overall data transducer amounts to approximately 5 $\mu$sec.

Figure 2:
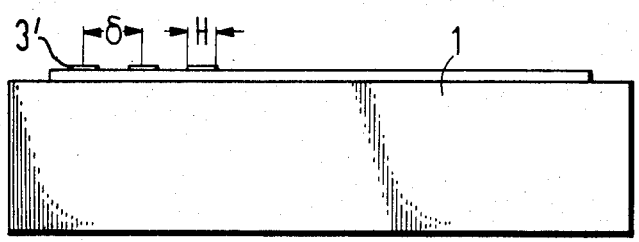
FIG. 2 is a side view of the transducer of FIG. 1.
Figure 3:
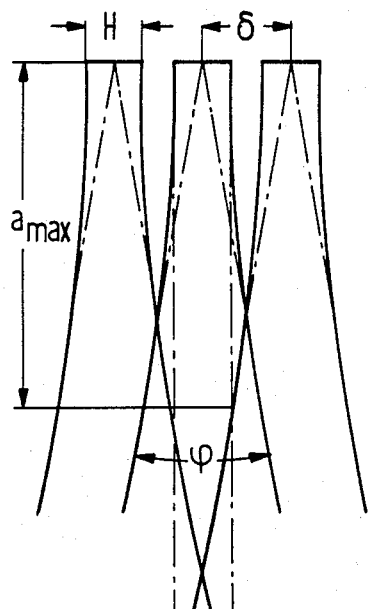
FIG. 3 is a schematic presentation of the sound diffraction of the transducer of FIG. 1.

The dimensioning of the light deflector will be described making reference to FIGS. 2 and 3. This dimensioning is based fundamentally on the data of the deflecting medium, the resolution of the sub-deflectors and the cross talk of two adjacent channels. When the sub-deflectors have a width H (FIGS. 2 and 3) which correspond to the width of a single electrode and the electrodes have a raster spacing $\delta$, thickness $a$ in the $y$ direction of the glass block 1 must be smaller than or equal to $$\frac{2\delta - H}{\phi_{max}}$$

where $\phi$ max is the maxiumum angle of diffraction of the sound beams. In order to avoid cross talk between two adjacent channels which have a deflector band width $\alpha_f$ of a value of 59 MHz, the above relationship requires the following dimensions for a data transducer having $n = 100$ channels: H=0.5mm, $a_{max} = 8.6$ mm and the width in the $x$ direction of the data input transducer is $b = 75$ mm.

The guidance of the beam deflected by the transducer to a storage medium is represented by FIG. 4 for the $y$–$z$ plane and by FIG. 5 for the $x$–$z$ plane. In both FIGS. 4 and 5, the plane wave or group of parallel laser beams 5 is directed to pass through the glass body 1 from the left to the right. Since a signal containing a frequency mixture is applied to each of the electrodes 3 of the transducer 2, sound waves with $m$ different frequencies are propagated downward in each deflection unit to produce a group of sub-beams which are represented by the boundary lines 8 and 9 and are deflected mainly in the $y$–$z$ plane. The groups of sub-beams 8 and 9 pass via the cylindrical lenses 10, 11 and 12 (FIG. 4) to the lens elements 13 and 14 of the lens raster 15 and then through an adjoining condensor lens 16 to the storage plate or medium 17. The lens element of the lens raster 15 widen each of the sub-beams to illuminate the entire area of the storage medium 17. The lens raster 15 is of two dimensional design and consists of $n$ times $m$ lens elements.

The beams from one deflecting unit are spaced from the beam of the other deflecting unit. In FIG. 5, this spacing is illustrated by beams 8' and 9' which pass through cylindrical lenses 18 and 19 which cause each of the $n$ times $m$ deflected sub-beam directions to pass through one of the $n$ times $m$ lens elements of the lens raster 15.

In order to record items of data on the storage medium 17 in a holographical fashion, the storage medium is illuminated not only with the above-mentioned beams which act as object beams but also with a reference beam or wave such as 5' in FIG. 5. However, the beams produced by a sub-deflector are displaced from one another in frequency due to the deflection by a plurality of frequencies which deflection takes place simultaneously in the light deflector units. In order, inspite of this frequency shift, to facilitate the capacity for interference between object and reference beams inspite of their frequency shift, the group of laser beams 5 will be from a dye laser or a super-radiation laser which both possess laser band widths of approximately 200 MHz. As the Doppler shift in the object beams amounts to a maximum of 40 MHz, this Doppler shift will no longer affect the capacity for interference between object beam and the reference beam.

If an acousto-optical Doppler compensator is additionally employed in the device, the data input transducer can also be operated with a narrow-band laser, for example a high power gas laser. In FIGS. 6 and 7, the device to the cylindrical lenses 12 and 19 and the beam paths are the same as described in FIGS. 4 and 5. An acousto-optical Doppler compensator 20, which in its fundamental constructions is identical to the light deflector of FIG. 1, is placed in the beam paths following the cylindrical lenses 12 and 19. All of the sub-beams deflected by this light deflector in the same direction, such as direction 7, 7' in FIG. 1 will experience the same frequency shift. Therefore, a sub-deflector 21 in the Doppler compensator 20 will be sufficient for all these sub-beams. Each of the sub-deflectors of the Doppler compensator 20, in contrast to the acousto-optical light deflector of FIG. 1, is operated only with a frequency which will compensate for a given Doppler shift, for all of the sub-beams which are deflected in the same direction and amount. The frequency shifts produced in the light deflector of FIG. 1 are moved back by the Doppler compensator 20 by the same order of magnitude so that the light beams emerging on the right side of the Doppler compensator have the same frequency as the group of laser beams 5 entering in the light deflector shown on the left of the figure. Therefore, all the sub-beams of the object beams which hit the storage plate 17 will again possess the same frequency as the group of reference beams.

Figure 8:
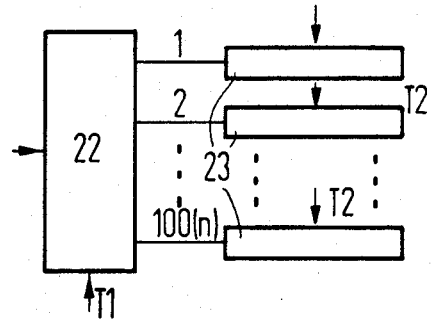
FIGS. 8 and 9 are block diagrams of the means for operation of the input transducers of the present invention.
Figure 9:
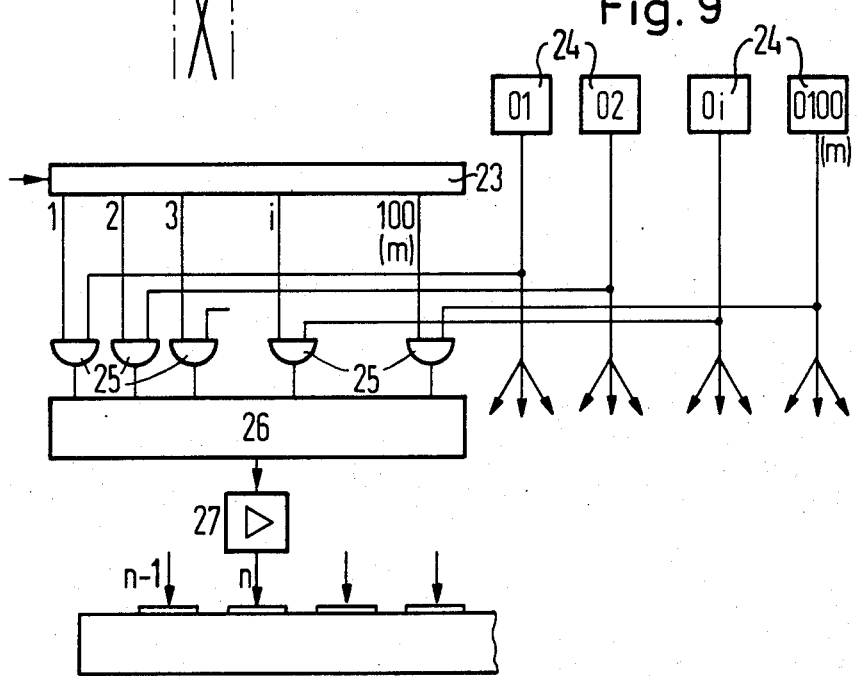

The process for the operation of an acousto-optical data input transducer with $100 \times 100 = 10{,}000$ elements will be explained making reference to FIGS. 8 and 9.

The data, which is fed in serial fashion with a data rate of 10 MHz to 1 GHz and which is to be represented in the data transducer, is firstly divided up with the aid of a demultiplexer 22 between the 100 channels which are to be fed. This divided data is intermitently stored in 100 shift registers 23 with each register containing 100 bits.

The two pulse trains $T_1$ and $T_2$ which control the demultiplexer 22 and the shift registers 23 are stepped down in frequency in relation to one another by the factor 100.

Each shift register 23 contains the data assigned to the relevant channel or deflection unit. A chain of high frequency oscillators 24 centrally supplies each of the channels. Each of the bits of data in each register 23 (FIG. 9) is applied to a separate gate 25. The high frequency signals is modulated into each of the 100 gates 25. The combined output of each gate 25 is applied to an adder 26 which produces a signal of multiple frequencies. The signal from the adder 26 is amplified in an integrated wide-band amplifier 27 with a maximum of 50 mW output power. The output of the amplifier 27 is connected to the electrode which is assigned to the relevant channel or deflection unit, of the acousto-optical light deflector.

Figure 10:
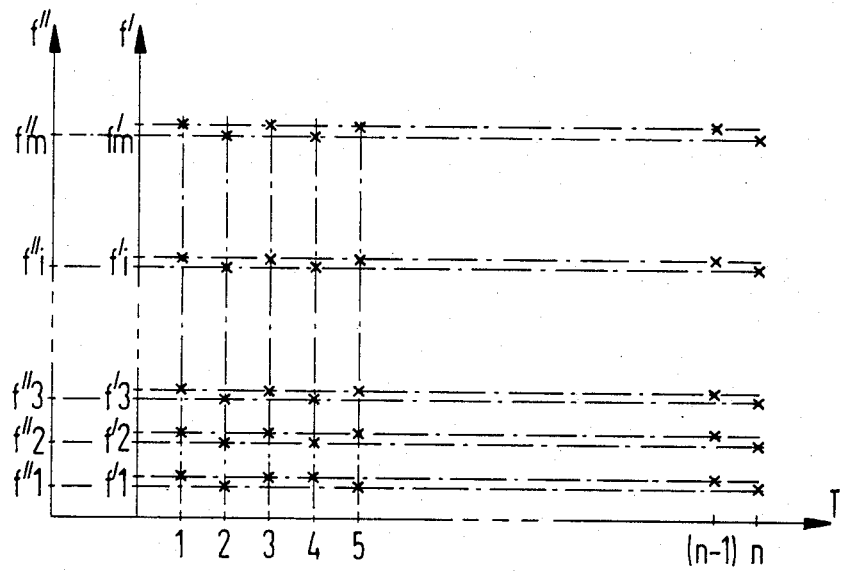
FIG. 10 is a diagrammatic illustration for avoiding cross talk between adjacent portions of the input transducer.

An alternative process to avoid cross talk between adjacent sub-deflectors is shown with the diagram in FIG. 10. In the diagram the frequencies $f_i'$ and $f_i''$ are plotted over the $n$ sub-deflectors or deflector units of the acousto-optical light deflector which are operated in response to signals with these frequencies. In order to entirely eliminate the cross talk between two of the $n$ adjacent sub-deflectors in the acousto-optical light deflectors and thus to obtain lower values for the permissable sub-deflector width H, the frequency rasters $f_i''$ and $f_i'$ of the even-numbered sub-deflectors and of the odd-numbered sub-deflectors respectively are displaced in relation to one another by a few kHz.

In accordance with the illustrated exemplary embodiment the acoutso-optical light deflector possesses an even number $n$ of sub-deflectors. All the even-numbered sub-deflectors (2., 4., 6., . . . , n.) are operated with the $m$ frequencies $f_i''$ and all the odd-numbered sub-deflectors (1., 3., 5., . . . , n-1) are operated with the $m$ frequencies $f_i'$. The frequencies $f_i''$ are a few kHz below the frequencies $f_i'$.

Figure 11:
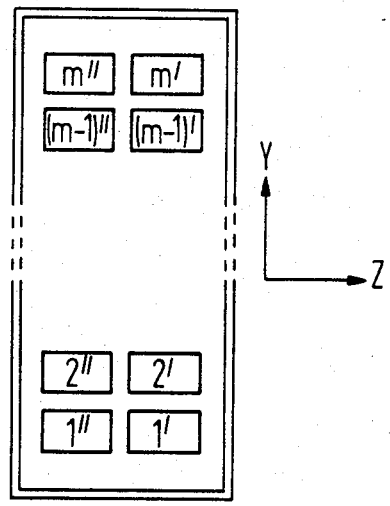
FIG. 11 is a plan view of a Doppler shift compensator used when avoiding cross talk between adjacent portions of the transducer.

Each of the $m$ sub-deflectors in the Doppler compensator 20 must then (see FIG. 11) contain two rows of electrodes $i''$ and $i'$ which electrodes are in series in the Z-direction. The front or first row of electrodes $i''$ is fed with the Doppler shift which is to be compensated in the even-numbered sub-deflectors of the acousto-optical light deflector. The rear or second row of electrodes $i'$ is fed with the Doppler shift which is to be compensated in the odd-numbered sub-deflectors in the acousto-optical light deflector.

A compensation for the deflection efficiency, which is generally dependent upon frequency, for example, the standardization of the brightness of all the produced directions, can be achieved by suitable dimensioning of the adder 26.

The control electronics is entirely constructed from an integrated circuit which may be inexpensively produced. Thus, the transducer of the present invention fulfills an important requirement of all switchable data input transducers.

Although various minor modifications might be suggested by those versed in the art, it should be understood that I wish to employ within the scope of the patent granted hereon, all such modifications as reasonably and properly come within the scope of my contribution to the art.

I claim:

1. In an apparatus for holographically recording data on a storage medium with the data being block-organized holographic data, said apparatus comprising means providing a coherent reference beam and a laser beam having a coherent optical plane wave, means for spatially modulating the laser beam into a plurality of object beams, means for directing the plurality of object beams at a storage medium to interfere with the reference beam to form the holographic recording on the storage medium, the improvements comprising said means for spatially modulating comprising an acousto-optical light deflector having a large area piezoelectric sound transducer disposed on one side thereof, said sound transducer having $n$ electrodes spaced thereon to form $n$ transducer units, means associated with each electrode for creating and applying a signal to each electrode with the signal being a frequency mixture of $m$ frequencies to deflect the beam passing through each unit into $m$ beam directions with the light frequency of each beam direction having a Doppler shift associated with the amount of deflecting, said means for directing the object beams including a lens raster consisting of $n$ times $m$ lens elements arranged in such a manner that each of the individual object beams produced by the means for modulating is widened to illuminate the entire storage medium, and said apparatus including means compensating for the Doppler shift in the light frequency of each of the object beams so that the capacity of interference of each of the object beams with the reference beams is maintained.

2. In an apparatus according to claim 1, wherein the means compensating for the Doppler shift comprises said means producing the laser beam producing a laser beam with a band width which is greater than the maximum Doppler shift of the light frequency.

3. In an apparatus according to claim 2, wherein the means producing the laser beam is a dye laser.

4. In an apparatus according to claim 2, wherein the means producing the laser beam is a super-radiation laser.

5. In an apparatus according to claim 1, wherein the means compensating for the Doppler shift in the light frequency is an acousto-optical Doppler compensator disposed between the acousto-optical light deflector and the lens raster, said compensator having $m$ piezoelectric units with each unit being connected to a separate oscillator so that the i-th unit of the Doppler compensator deflects all the light beams from the acousto-optical light deflector in the direction i to compensate for the Doppler shift of the light frequency thereof.

6. In an apparatus according to claim 1, wherein the means for creating and applying a signal includes at least one shift register to receive the individual data assigned to each unit of the acousto-optical light deflector, a plurality of gates connected to the shift register for receiving individual data therefrom, a plurality of high frequency oscillators, with each oscillator separately connected to an individual gate, and an adder for receiving the output of the gates and forming a multi-frequency signal applied to each electrode.

7. In a process for holographically recording data on a storage medium with the data being block-organized holographic data, said process comprising providing a coherent reference beam and a laser beam having a coherent optical plane wave, spatially modulating the laser beam into a plurality of distinct object beams, directing the plurality of object beams at a storage medium to interfere with the reference beam to form the holographic recording on the storage medium, the improvement comprising the step of providing the laser beam providing a continuous line laser beam, the step of spatially modulating comprising providing an acousto-optical light deflector having a large area piezoelectric sound transducer disposed on one side thereof, said sound transducer having $n$ electrodes spaced thereon to form $n$ transducer units, and applying a signal to each of the electrodes with the signal being a frequency mixture of $m$ frequencies to deflect the beam passing through each unit into $m$ beam directions with the light frequency of each beam direction having a Doppler shift which is dependent upon the amount of deflecting, said step of directing the object beams including widening each of the object beams to illuminate the entire storage medium and the process including compensating for the Doppler shift in the light frequency of each of the object beams so that the capacity of interference of each of the object beams with the reference beams is maintained.

8. In a process according to claim 7, wherein the step of modulating the laser beam to create a plurality of object beams in both the $n$ and $m$ directions including providing a representation of a selected logic one and zero by selectively changing the multiple frequency to control the creation of an object beam in a given beam direction.

9. In a process according to claim 7, wherein the step of modulating the laser beams to create a plurality of object beams transmitting in both the $n$ and $m$ directions includes applying a logic zero on an individual light beam by changing the amount of Doppler shift in the light frequencies of selected object beams so that the interference capacity between the object beam and the coherent reference beams is prevented.

10. In a process according to claim 7, wherein the step of applying a signal to the electrodes of each of the individual $n$ units includes applying a multiple frequency raster $f_i'$ to the odd number units and applying a multiple frequency raster $f_i''$ to the even number units with the frequency raster $f_i''$ being displaced a selected few kHz from the frequency raster $f_i'$ and wherein the step of compensating for the Doppler shift of the light frequency comprises providing two rows each of $m$ sub-deflector arranged in series in the path of the object beams with the front row providing a compensation for Doppler shift which is caused by the even number deflector units and the second row compensating for the Doppler shift which is created in the odd number deflector units.

* * * * *